(12) United States Patent
Baraduc et al.

(10) Patent No.: US 8,878,618 B2
(45) Date of Patent: Nov. 4, 2014

(54) SPIN TRANSFER OSCILLATOR

(75) Inventors: Claire Baraduc, Chirens (FR); Bernard Dieny, Lans en Vercors (FR); Christophe Thirion, Lans en Vercors (FR); Nicolas De Mestier Du Bourg, Paris (FR)

(73) Assignees: Commissariat a l'energie atomique et aux energies alternatives, Paris (FR); Centre National de la Recherche Scientifique, Paris (FR)

( * ) Notice: Subject to any disclaimer, the term of this patent is extended or adjusted under 35 U.S.C. 154(b) by 140 days.

(21) Appl. No.: 13/702,413

(22) PCT Filed: Jun. 9, 2011

(86) PCT No.: PCT/EP2011/059558
§ 371 (c)(1),
(2), (4) Date: Mar. 15, 2013

(87) PCT Pub. No.: WO2011/154477
PCT Pub. Date: Dec. 15, 2011

(65) Prior Publication Data
US 2013/0169371 A1   Jul. 4, 2013

(30) Foreign Application Priority Data
Jun. 9, 2010   (FR) .................... 10 54530

(51) Int. Cl.
*H03B 15/00*   (2006.01)
*H01F 10/32*   (2006.01)
*H03B 28/00*   (2006.01)
*B82Y 25/00*   (2011.01)

(52) U.S. Cl.
CPC ............ *H03B 28/00* (2013.01); *H01F 10/3254* (2013.01); *H01F 10/3268* (2013.01); *H01F 10/32* (2013.01); *H03B 15/006* (2013.01); *B82Y 25/00* (2013.01)
USPC ..... 331/107 R; 331/187; 331/94.1; 360/324.1

(58) Field of Classification Search
CPC ..................................................... H03B 15/006
USPC .................................. 331/94.1, 3, 107 R, 187
See application file for complete search history.

(56) References Cited

U.S. PATENT DOCUMENTS 7,504,898 B2 *   3/2009   Fukuzawa et al. ............... 331/96
7,589,600 B2 *   9/2009   Dimitrov et al. ............. 331/94.1
(Continued)

FOREIGN PATENT DOCUMENTS

FR   2939256   6/2010

OTHER PUBLICATIONS

International Search Report as issued for PCT/EP2011/059558.

*Primary Examiner* — Ryan Johnson
(74) *Attorney, Agent, or Firm* — Pillsbury Winthrop Shaw Pittman LLP

(57) ABSTRACT

A spin transfer oscillator including a magnetic stack including at least two magnetic layers, at least one of the two magnetic layers is an oscillating layer that has variable direction magnetization and a current supply device configured to cause the flow of a current of electrons perpendicularly to the plane of the magnetic stack. The magnetic stack includes a device to generate inhomogeneities of current at the level of the surface of the oscillating layer and the intensity of the current supplied by the supply device is selected such that the magnetization of the oscillating layer has a consistent magnetic configuration, the magnetic configuration oscillating as a whole at the same fundamental frequency.

21 Claims, 6 Drawing Sheets

(56) References Cited

U.S. PATENT DOCUMENTS

| | | | |
|---|---|---|---|
| 8,098,105 B2 * | 1/2012 | Cyrille et al. | 331/94.1 |
| 2007/0109147 A1 | 5/2007 | Fukuzawa et al. | |
| 2010/0308923 A1 * | 12/2010 | Kaka | 331/46 |
| 2011/0038198 A1 * | 2/2011 | Kent et al. | 365/158 |

* cited by examiner

SPIN TRANSFER OSCILLATOR

CROSS-REFERENCE TO RELATED APPLICATIONS

This is the U.S. National Stage of PCT/EP2011/059558, filed Jun. 9, 2011, which in turn claims priority to French patent application Ser. No. 1054530, filed Jun. 9, 2010, the entire contents of all applications are incorporated herein by reference in their entireties.

FIELD OF THE INVENTION

The present invention belongs to the field of spin transfer radiofrequency oscillators, known as STO ("Spin Torque Oscillator") oscillators.

BACKGROUND OF THE INVENTION

These STO oscillators are intended to operate in frequency ranges of between a few hundred MHz and a few GHz.

The present invention belongs to the field of spin transfer radiofrequency oscillators, known as STO ("Spin Torque Oscillator") oscillators.

These STO oscillators are intended to operate in frequency ranges of between a few hundred MHz and a few GHz.

The term oscillator designates a physical system in which at least one of the properties varies in a periodic or quasi-periodic manner over time. The role of an oscillator is to be used as a time and frequency reference.

In particular, oscillators are widely used in the telecommunications field. For example, oscillators of the VCO "Voltage Controlled Oscillator" type are known: These devices are based on a resonant electronic circuit comprising a resistance R, an inductance L and capacitance C, the whole forming an RLC circuit. VCO oscillators not only use this RLC architecture but also have an electrical bias voltage enabling the L and C values to be varied and thereby to modify the frequency.

The electronics of new telecommunications products (mobile telephones for example) must be capable of working over very large frequency ranges. Therefore, VCOs must be capable of transmitting over several frequency ranges. For example, current portable telephones have three or four frequency bands. In addition, the development of mobile technologies imposes additional constraints in terms of the compactness of the products.

Consequently, to meet these demands, either an oscillator with high frequency tunability or agility to cover all frequency ranges must be used or several oscillators must be used. The first solution is the most suitable but is not possible with a single VCO that has too low agility. Consequently, the current solution involves the use of several VCOs, which poses a problem of bulkiness and adds interference phenomena between the various VCOs.

A known solution that is likely to meet the problems mentioned above consists of turning to spintronic device-based radiofrequency oscillators known as STO oscillators.

The operation of these STOs is based on the effects of GMR ("Giant MagnetoResistance"), such as with spin valves, and on the effects of TMR ("Tunnel MagnetoResistance"), such as with MTJ magnetic tunnel junctions.

These structures consist of a stack of magnetic layers, the nature and arrangement of which are made so that when an electrical current traverses them, it is possible to obtain a variable resistance according to the magnetic field applied and/or the spin polarized current that traverses them. Such a device is constituted of a stack of two ferromagnetic layers (one magnetic layer called "pinned," the magnetization of which is at a fixed direction and one layer called "free," the magnetization of which is variable) separated by an amagnetic (not magnetic) layer conventionally called a spacer, made in metal for spin valves or in oxide for magnetic tunnel junctions.

In a known manner, when the magnetization orientation of the two ferromagnetic layers is identical, this is then called parallel orientation; the device is in the low resistance state. Consequently, when the orientation of the two ferromagnetic layers is antiparallel, the device is in the high resistance state.

Spin electronics uses the spin of electrons as an additional degree of freedom, in order to generate new effects. The spin of electrons is at the origin of magnetoresistance phenomena in magnetic multilayers, such as, in particular, giant magnetoresistance or tunnel magnetoresistance.

In fact it has been shown that by passing a spin polarized current through a thin magnetic layer and depending on the amplitude of said current, two distinct effects may be induced:

First of all, a reversal of its magnetization in the absence of any external magnetic field; this phenomenon may also be implemented as a means of writing information in the context of producing magnetic random access memories, also called MRAM;

but also, the excitation of sustained precession states of the magnetic moment of the layer: This phenomenon is used in STO.

Therefore, the operating principle of STO (Spin Torque Oscillator) consists of using the spin transfer torque to trigger sustained magnetization precession. In a magnetoresistive device, this precession causes oscillation of the resistance and therefore generation of alternating voltage in the GHz range. The major advantage of STO oscillators is their high frequency agility since resonance frequency operates over a very wide band depending on the polarization applied to the spintronic device.

The main technical problem posed by STO remains the spectral purity of these oscillators, the bandwidth typically being a few dozen MHz in the best cases (see for example, Mizushima et al, Appl. Phys. Lett. 94, 152501, 2009; Georges et al., Phys. Rev. B 80, 060404(R), 2009). This high bandwidth is due to magnetization trajectory instabilities. This problem is not only connected to thermal fluctuations but is also present at low temperatures (cf. Georges al., Phys. Rev. B 80, 060404(R), 2009).

One of the solutions considered to increase the power and possibly reduce the bandwidth of these STO oscillators is to couple them, either physically on the same device (cf. Kaka et al., Nature 437, 389, 2005), or electrically by connecting them to each other (cf. Georges et al., Appl. Phys. Lett. 92, 232504, 2008). These methods effectively show a coupling of oscillators over a certain frequency range.

However, such a solution poses certain difficulties.

In fact, so that this coupling leads to a synchronization of oscillators, the latter must have very similar properties from the start, which is not easy to achieve from a technological point of view.

In addition, synchronization reduces the frequency tunability of the assembly of coupled oscillators.

In addition, it will be noted that currently, the power emitted by these STOs is relatively weak (at most a few thousand $nV^2/Hz$—cf. for example, Houssameddine et al., Appl. Phys. Lett. 93, 022505, 2008).

A known solution for increasing the radiofrequency signal power produced by spin transfer oscillators is described in U.S. Pat. No. 7,504,898. This document proposes using a separating layer of the CCP-GMR ("Current-Confined-Paths-GMR") type. CCP-GMR structures are characterized by an insulating layer (sometimes called "current screen layer") pierced with small holes or conductive bridges (also designated by the term "pinholes"), situated at the center of the magnetic stack, generally between the soft free layer of the GMR structure and the pinned reference layer. The principle described in this document is to take advantage of the high current densities near the conductive bridges to generate magnetization oscillations locally without risking reversal of the magnetization of the soft layer. In fact, in the areas separating the conductive bridges, as the current densities are much lower, the magnetization of these areas is not subject to spin transfer torque and therefore remains almost at rest. Therefore, the excitations generated at the level of each conductive bridge are joined to one another through spin waves. But, between each conductive bridge, an intermediate area remains in which the magnetization is not globally excited. These areas may be traversed by spin waves issued from nearby conductive bridges but do not undergo high amplitude magnetic excitation.

Such a solution also presents certain disadvantages.

Thus, despite an increase in power, the power emitted by STO devices such as described in document U.S. Pat. No. 7,504,898 will remain relatively weak.

In addition, the operating regime of such a device will provide very little harmonic frequency (which may be used in addition to the fundamental frequency).

BRIEF SUMMARY OF THE INVENTION

In this context, the object of the present invention is to provide a spin transfer oscillator presenting, compared to existing STOs, increased emitted power, a good quality factor, very high spectral purity (i.e., narrow fundamental frequency bandwidth), reduced phase noise and the possibility to exploit a plurality of harmonics in order to be able to exploit higher frequencies.

For this purpose, the invention proposes a spin transfer oscillator comprising:
 a magnetic stack including at least two magnetic layers in which at least one of said two magnetic layers, called an oscillating layer, has variable direction magnetization;
 current supply means capable of causing the flow of a current of electrons perpendicularly to the plane of said magnetic stack;
Said magnetic stack comprises means capable of generating inhomogeneities of current at the level of the surface of said oscillating layer, said oscillator being characterized in that the intensity of the current provided by said supply means is chosen such that the magnetization of said oscillating layer presents a consistent magnetic configuration, said magnetic configuration oscillating in its entirety at the same fundamental frequency.

Consistent magnetic configuration is understood to refer to a configuration that is close to the magnetic monodomain or that presents magnetization rotations on a length scale comparable to the lateral dimension of the surface of the oscillating layer: It may be a configuration of the magnetic vortex, magnetic antivortex, multivortex or "C-state" type or a combination of these configurations (for example several vortices or one or more vortex-antivortex pairs). By way of examples, such consistent micromagnetic configurations are described in the article "Stability of magnetic vortices in flat submicron permalloy cylinders" (M. Schneider et al, Journ. Appl. Phys. 92 (2002)1466). In the rest of the description, we will talk about a vortex configuration for this consistent magnetic configuration but the person skilled in the art will be able to implement the invention for other types of consistent magnetic configurations.

It will be noted that the oscillating layer may be a simple ferromagnetic layer but also a synthetic antiferromagnetic layer comprising two soft ferromagnetic layers, possibly with different thicknesses, separated by an antiferromagnetic coupling layer.

The oscillator according to the invention is based on collective and consistent excitation dynamics of the magnetization of the entire device (for example the dynamics of a magnetic vortex) induced by the spin transfer torque in a magnetic structure presenting strong lateral inhomogeneities in the distribution of current traversing the structure via means able to generate current inhomogeneities at the level of the surface of the oscillating layer: These inhomogeneities may for example be created in a non-limited manner by a set of conductive nanobridges through an insulating barrier that allows the current lines to be locally concentrated. Typically, these inhomogeneities lead to fluctuations of more than a factor of 10 in conductivity between the most conductive areas and the least conductive areas.

The present invention is set apart from the prior art (and particularly from document U.S. Pat. No. 7,504,898) in that the structure with inhomogeneous current is not used to generate magnetization precessions on the localized areas interacting with each other by spin waves; On the contrary, in a surprising manner, the applicant realized that a current intensity greater than a threshold determined according to the magnetic structure would enable collective excitation dynamics of all of the magnetization of the oscillating layer of the oscillator to be triggered, such as for example vortex type dynamics, the fundamental frequency of which is generally situated at a lower frequency (on the order of a few hundred MHz) than the fundamental frequency of known STOs. Therefore in the present invention, magnetization operates over the entire surface of the excited layer of the oscillator (oscillating layer) leading to a complete mixing of the magnetization of this layer. In other words, the present invention does not seek at all to prevent the magnetization of the excited layer from being reversed, contrary to U.S. Pat. No. 7,504,898 but, on the contrary, seeks to induce a collective excitation movement of the consistent magnetic configuration of magnetization of the excited layer of the oscillator, including the entire surface of the layer. Therefore, the invention is based on the use of spin transfer torque generated by the distribution of inhomogeneous current that, by the averaging effect due to exchange interactions inside the oscillating layer, collectively excites all of the magnetization of this oscillating layer. This state, that simulations demonstrate, is physically confirmed by its consequences such as the high number of harmonics. This is an essential difference from document U.S. Pat. No. 7,504,898, in which the magnetization excitation of the soft layer is produced near pinholes, while the magnetization between pinholes is not or is only weakly excited. In the embodiment of the invention, a large number of harmonics is observed, which is not the case with the operating regime of U.S. Pat. No. 7,504,898. Therefore, according to the invention, at least four exploitable amplitude harmonics are observed, contrary to the operating regime of U.S. Pat. No. 7,504,898.

As will be seen in further detail subsequently, the principle of the invention therefore consists of using a structure with inhomogeneous current to generate simultaneously:
 a consistent micromagnetic configuration of the magnetization resulting from the equilibrium between the amperian field produced by the current traversing the structure, the field effects demagnetizing the structure and the exchange interactions within the oscillating layer;

an intense spin transfer effect essentially located at the level of the points of high current density but producing collective excitation of the magnetization over the entire surface of the oscillating layer due to the exchange interactions existing inside the oscillating layer.

It will be noted that the first effect (appearance of a consistent magnetic configuration) may only intervene for a lower current intensity; one then has a consistent static magnetic configuration; By increasing the current intensity beyond a threshold intensity, the two effects are observed simultaneously (consistent dynamic magnetic configuration).

The use of systems with strongly inhomogeneous current is in an intermediate situation between that of all-metal stacks (spin valve with introduction of current perpendicularly to the plane of the layers) and those with magnetic tunnel junctions. The advantage of the present invention compared to all-metal stacks is to offer a higher resistance times surface area and, correlatively, a higher absolute magnetoresistance and therefore stronger RF signals generated by the excitation caused by the spin transfer. In addition, the advantage of the present invention compared to magnetic tunnel junctions is to pass more current through the structure, of equal cross section, leading to a high amperian field and therefore the possibility to generate a vortex type configuration having consistent dynamics, which could not be obtained with a tunnel junction. In fact in a tunnel junction, the current density is limited by the electric breakdown of the junction. Consequently, the only way to increase the total current through a tunnel junction is to increase its cross section but this leads to a loss of consistency of the magnetization dynamics.

The oscillating movement of the consistent magnetic configuration (typically the cyclical movement of the vortex) thus obtained leads to a cyclic temporal change of the mean magnetization, and consequently to resistance oscillation because of the magnetoresistive effect. Thus alternating voltage may be generated at the terminals of the device, presenting an intense fundamental mode (typically between 300 and 500 MHz) and many harmonics (typically from 12 to 15).

It will be noted that the oscillator according to the invention may operate either with a fixed magnetization layer (pinned layer) and a variable magnetization layer (oscillating layer) or with two oscillating layers (with or without a reference layer), the only condition being that the magnetic stack comprises at least two magnetic layers, one of which is an oscillating layer with variable direction magnetization.

The invention enables an oscillator that is frequency tunable, but with high power (several hundred thousand $nV^2/Hz$ or one to two orders of magnitude higher than known STOs) and with very high spectral purity (Q>300, $\Delta f$<2 MHz) to be produced. The fundamental frequency is typically between a few hundred MHz and a few GHz. The device according to the invention also generates a large series of harmonics (typically at least four harmonics, the amplitude of which remains less than that of the fundamental frequency but is sufficient to be widely exploitable): Therefore, according to the considered application, the fundamental frequency emitted or some of the harmonics generated by the oscillator may be used for upconverting.

The oscillator according to the invention may also present one or more of the characteristics below, considered individually or according to all technically possible combinations:

said means able to generate current inhomogeneities at the level of the surface of said oscillating layer are formed by a layer presenting strong conductivity inhomogeneities able to generate in said oscillating layer strong lateral current inhomogeneities;

said layer presenting strong conductivity inhomogeneities able to generate in said oscillating layer strong lateral current inhomogeneities is a layer characterized by conductivity fluctuations of more than a factor of 10 between its most conductive areas and its least conductive areas;

said layer presenting strong conductivity inhomogeneities is an insulating layer integrating metal paths;

said layer presenting strong conductivity inhomogeneities is a tunnel junction integrating conductive paths obtained by exposure of said junction to a suitable voltage (i.e., the voltage must be sufficiently high to locally generate electric breakdown phenomena);

said layer presenting strong conductivity inhomogeneities is made from a base of a mixture of two materials with different conductivities able to demix under the effect of annealing to form paths locally that are more conductive than on the rest of the layer; in other words, said layer presenting strong conductivity inhomogeneities is made from a base of a mixture of two immiscible materials having different electrical conductivities so as to form strong electrical conductivity inhomogeneities under the effect of annealing causing the two constituent materials to demix;

said layer presenting strong conductivity inhomogeneities presents a ratio of electric conductivity equal to or greater than 10 between its most conductive areas and its least conductive areas;

said layer presenting strong conductivity inhomogeneities comprises a non-magnetic metallic layer in contact with at least one of its faces;

said means able to generate current inhomogeneities at the level of the surface of said oscillating layer are formed by a plurality of nanocontacts;

said consistent magnetic configuration is a configuration of the magnetic vortex, magnetic antivortex, multivortex or "C-state" type or a combination of these configurations;

said magnetic stack has the form of a pillar, the cross section of which has one of the following forms:
circular;
elliptical;
annular;
form with axial symmetry comprising at least three lobes;

the diameter in the case of a circular, annular or flower-form cross section is the larger of two diameters; in the case of a cell with an elliptical form, it is between 10 nm and 500 nm and preferentially between 100 and 500 nm;

said oscillating layer presents a substantially circular cross section with a radius R and thickness L, the L/R ratio being chosen according to the operating frequency of the oscillator, if necessary repeatedly by using micromagnetic simulation software to determine the corresponding frequency at a given L/R value;

said magnetic stack successively comprises:
a magnetic reference layer with a fixed magnetization direction;
a layer with strong lateral electrical conductivity inhomogeneities;
said oscillating magnetic layer with a variable magnetization direction;

said magnetic stack successively comprises two magnetic sub-stacks separated by a magnetic decoupling layer, each of the two sub-stacks integrating:

a magnetic reference layer with a fixed magnetization direction;
a layer with strong lateral electrical conductivity inhomogeneities;
an oscillating magnetic layer with a variable magnetization direction;
said magnetic stack comprises a magnetic sub-stack successively including:
a magnetic reference layer with a fixed magnetization direction;
an amagnetic decoupling layer;
said oscillating magnetic layer with a variable magnetization direction;
said means able to generate current inhomogeneities at the level of the surface of said oscillating layer are located outside of said sub-stack;
said magnetic stack comprises two magnetic sub-stacks, each sub-stack successively including:
a magnetic reference layer with a fixed magnetization direction;
an amagnetic decoupling layer;
an oscillating magnetic layer with a variable magnetization direction;
said two sub-stacks being separated by a layer presenting strong conductivity inhomogeneities;
said magnetic stack comprises two oscillating ferromagnetic layers of variable magnetization direction separated by said means able to generate current inhomogeneities at the level of the surface of said oscillating layers;
said magnetic stack comprises:
a magnetic sub-stack successively including:
a first oscillating magnetic layer with a variable magnetization direction;
an amagnetic decoupling layer;
a second oscillating magnetic layer with a variable magnetization direction;
first means able to generate current inhomogeneities at the level of the surface of said first oscillating layer;
second means able to generate current inhomogeneities at the level of the surface of said second oscillating layer;
Said first and second means able to generate current inhomogeneities being located outside said sub-stack.

BRIEF DESCRIPTION OF THE DRAWINGS

Other characteristics and advantages of the invention will-clearly emerge from the description given below, for indicative and in no way limiting purposes, with reference to the attached figures, among which.

DETAILED DESCRIPTION OF THE INVENTION

Figure 3:
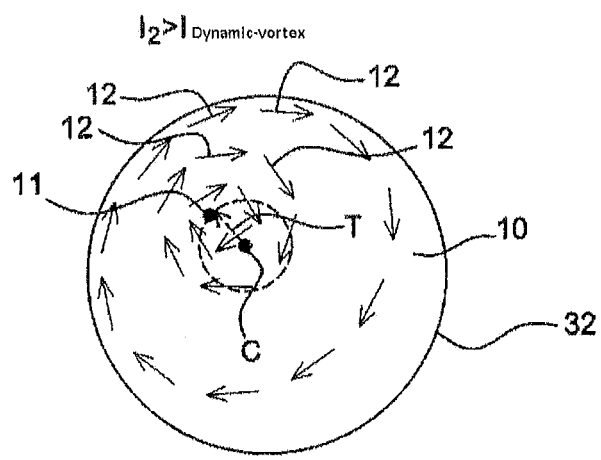
Figure 4:
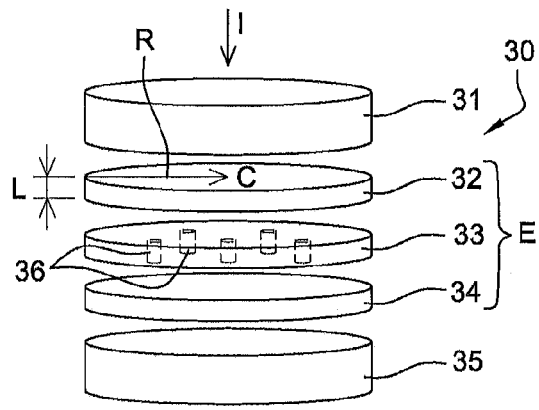
FIG. 4 illustrates a first embodiment of an oscillator according to the invention.
Figure 15:
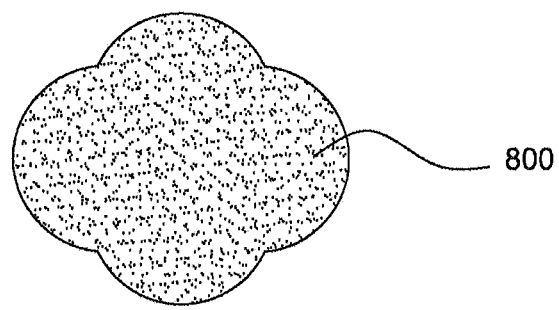
FIG. 15 illustrates a particular cross section of an oscillator according to the invention.

FIG. 4 schematically illustrates a first embodiment of an oscillator 30 according to the invention.
Oscillator 30 comprises a magnetic stack E successively including:
a ferromagnetic reference layer 34 with a fixed magnetization direction (here situated in the plane of the reference layer), known as the pinned layer;
a layer with strong lateral electrical conductivity inhomogeneities 33;
a ferromagnetic oscillating layer 32 with a variable magnetization direction presenting a magnetic configuration to which we will return with reference to FIGS. 1 to 3.
This stack E formed by the assembly of layers above is inserted between two current input electrodes 31 and 35 causing the flow of an electrical current of intensity I perpendicularly to the plane of the stack of magnetic layers. The two electrodes 31 and 35 form current supply means capable of causing the flow of a current of electrons perpendicularly to the plane of magnetic stack E.
This stack E has the form of a pillar that may have various forms of cross sections: Circular, elliptical, annular, or even more complex forms such as flowers with 3 or 4 petals (see below with regard to FIG. 15). The characteristic diameter of the device is typically a few dozen to a few hundred nm (typically <500 nm).
Reference layer 34 may be a simple layer made from an alloy based on Co, Fe, Ni, for example a 3 nm-layer of CoFe.
Reference layer 34 may also be a synthetic antiferromagnetic layer constituted of two ferromagnetic layers antiparallel coupled through a thin antiparallel coupling layer, for example in ruthenium with a thickness of 0.6 nm to 0.8 nm. This synthetic antiferromagnetic layer may itself be pinned by interaction with an antiferromagnetic spacer layer (for example in ruthenium); An example of a pinned synthetic antiferromagnetic layer is CoFe 2 nm/Ru 0.6 nm/CoFe 2.5 nm.
Layer 33 with strong lateral electrical conductivity inhomogeneities is a layer presenting in its plane strong lateral electrical conductivity inhomogeneities (typically characterized by conductivity fluctuations of more than a factor of 10 between the most conductive areas and the least conductive areas of layer 33).
This layer 33 with strong lateral electrical conductivity inhomogeneity may be made by using an insulating layer pierced by small conductive metal holes 36 (pinholes). The advantage of this separating layer is to enable confinement of current lines at the level of nanoconstrictions. This layer 33 structure is called a CCP ("Confined Current Path" or "current screen layer"). This particular separating layer may be made for example by depositing an AlCu alloy with a few % of copper that is then oxidized in order to form a layer of alumina containing a few metallic clusters that will form pinholes 36. Pinholes 36 typically have a size of 0.5 nm at about ten nanometers of diameter. The insulating layer containing pinholes 36 may be formed by oxidation, nitriding or oxynitriding an initially metallic layer containing at least one element from the following group: Al, Hf, Zr, Ta, Ti, Mo, W, Nb, Si, Mg. It typically has a thickness of between 0.8 and 3.5 nm. Pinholes 36 may be non-magnetic or magnetic and comprise at least one of the elements Cu, Ag, Au, Co, Fe or Ni.

This insulating barrier 33 pierced with conductive holes 36 is most often made by depositing a layer of metal alloys comprising two elements presenting a high difference in affinity for oxygen, for example a composition of Al95Cu5. This layer is then oxidized as a tunnel barrier by natural oxidation or plasma oxidation. Due to the difference in affinity for oxygen of aluminum and copper, the aluminum oxidizes into alumina while the copper coalesces in the form of copper aggregates, then forming conductive bridges through the layer of alumina.

In such a structure with inhomogeneous lateral conductivity, current densities in the areas of high conductivity may be very significant ($10^9$ to $10^{11}$ A/cm$^2$) such that the spin transfer effects may be very significant locally in normal operation. Spin transfer is the reciprocal effect of spin filtering implemented in giant magnetoresistance. In magnetoresistance phenomena, an electrical current may be controlled by acting on the relative orientation of the magnetizations of magnetic layers, according to a filtering effect similar to a polarizer-analyzer assembly in optics. The spin transfer effect corresponds to the reciprocal action of current on the filter: The spin-polarized current, if it is sufficiently intense, may modify the magnetization orientation of the oscillating layer 32.

The oscillating layer 32 is for example formed of a layer of Co or Permalloy (Ni80Fe20) alloys or Co-rich alloys of Co and Fe, for example Co90Fe10.

The invention advantageously uses the inhomogeneity of current created by layer 33 to generate simultaneously a double effect at the level of oscillating layer 32:

first of all a consistent micromagnetic configuration of the magnetization of oscillating layer 32 resulting from the equilibrium between the amperian field produced by the current traversing structure 30, the field effects demagnetizing the structure 30 and the exchange interactions within oscillating layer 32. This consistent micromagnetic configuration may be for example of the vortex, multivortex, antivortex or "C-state" type or may be a combination of these configurations;

an intense spin transfer effect essentially located at the level of the points of high current density producing collective excitation of the magnetization over the entire surface of oscillating layer 32 due to the exchange interactions, existing inside oscillating layer 32.

The consistent micromagnetic configuration of magnetization is influenced by the amperian field induced by the current circulating through the structure. This inhomogeneous field promotes the appearance of one or more vortex or vortices, or vortex-antivortex pair(s) (or antivortex or "C-state"). This particular magnetization configuration is obtained when the external magnetic field applied in the plane of the layers is weak (typically <20 mT), on the condition that the structure has previously been prepared magnetically in a state where the oscillating layer is saturated in an opposite-sign field (typically 60 mT).

To obtain a magnetic state of the vortex type presenting consistent dynamics, the magnetic stack E constituting the active part of the device must be of an intermediate dimension, neither too small so that the vortex has room to form nor too large so that the dynamics of this vortex maintain its consistency (typically a dimension, the diameter in the case of the cylindrical form of stack E, of 100 to 500 nm).

In addition, it is preferable that the form have a substantially cylindrical symmetry if one seeks to exploit the fundamental excitation signal. But other forms are possible if one seeks to amplify the amplitude of the harmonics signals which will be explained below with reference to FIG. 15.

Figure 1:
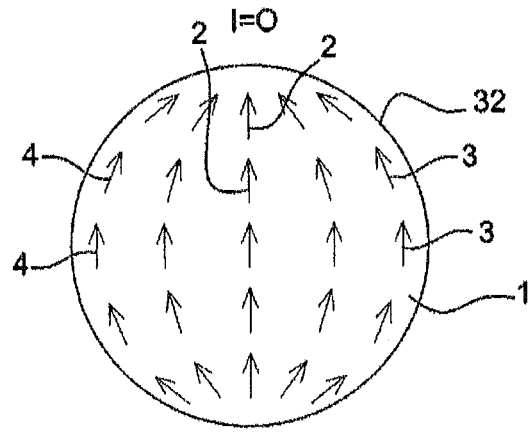
FIGS. 1 to 3 illustrate the evolution in the magnetic configuration of the oscillating layer of the oscillator according to the invention according to the current injected into the oscillator.
Figure 2:
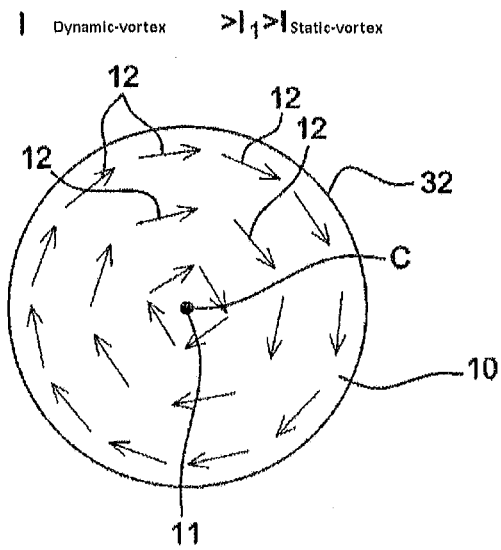

This double effect is illustrated in FIGS. 1 to 3 respectively showing the magnetic configuration of the oscillating layer 32 with a zero intensity of zero current traversing the structure 30 (FIG. 1), an intermediate current intensity $I_1$ (FIG. 2) and a current intensity $I_2$ higher than $I_1$ (FIG. 3).

FIG. 1 represents the magnetic configuration 1 of oscillating layer 32 in the absence of current traversing structure 30. This configuration 1 (the magnetization vectors are represented by arrows) presents a magnetization substantially having the form of leaf veins with a straight magnetization 2 at the center of layer 32 along a diameter of layer 32 and then a magnetization 3 that is slightly curved and symmetrical on both sides of magnetization 2 followed by a magnetization 4 that is still symmetrical on both sides of magnetization 2 and whose curvature is accentuated towards the edge of layer 32 to follow the circular form of layer 32.

The injection of current of intensity $I_1$ greater than a $I_{static\_vortex}$ threshold value (FIG. 2) creates an inhomogeneous amperian field promoting the appearance of a magnetic vortex state. Layer 32 in the vortex state has a spatially inhomogeneous magnetic configuration (i.e., the magnetization has a different orientation depending on the point where it is found), the magnetization is found in the plane of layer 32 and rotates either clockwise or counter-clockwise (here the clockwise direction is represented by arrows 12), the circular behavior of the magnetization is explained by the spontaneous minimization of the leakage field. In addition, a singularity at the center of vortex 10 is observed in an area 11 called the "vortex core," in which the magnetization can no longer rotate. In general, at the level of the core, the magnetization tends to go out of the plane but this does not play a significant role in the context of this invention. In FIG. 2, the vortex core 11 coincides with the center C of oscillating layer 32. Here this is a consistent static micromagnetic configuration appearing beyond a $I_{static\_vortex}$ threshold current.

Therefore, a current with an intensity greater than an intensity on the order of 15 mA will generate a static vortex for an oscillator according to the invention with a diameter on the order of 300 nm. In the case of a diameter on the order of 300 nm, the threshold current for the appearance of a consistent static micromagnetic configuration $I_{static\_vortex}$ is typically between 4 and 5 mA.

According to FIG. 3, for a current intensity greater than a $I_{dynamic\_vortex}$ threshold intensity (greater than $I_{static\_vortex}$), then the double effect mentioned above is observed at the level of oscillating layer 32, i.e., a consistent magnetic configuration 10 of the vortex type offset with relation to the magnetic configuration 10 of FIG. 2: the core 11 of the vortex is translated by a distance T with relation to the center C of layer 32 and vortex 10 undergoes a circular movement around center C of oscillating layer 32 (i.e., the vortex core 11 describes a substantially circular trajectory along a circle of radius T and center C). Therefore a sort of planetary motion of vortex 10 around center C of oscillating layer 32 is observed.

Thus, beyond a $I_{dynamic\_vortex}$ current threshold intensity, and for a chosen current polarity, the spin transfer effect may destabilize the magnetic configuration 10 and cause a cyclic movement of the vortex. Still in the case of an oscillator according to the invention with a diameter on the order of 300 nm, a current with an intensity of greater than 17 mA will generate a dynamic vortex (i.e., put the vortex in movement). In the case of a diameter on the order of 300 nm, the threshold current for the appearance of cyclic movement of the vortex $I_{dynamic\_vortex}$ is typically between 17 and 20 mA. It should be noted that the movement of the vortex then persists when the current is lowered below this threshold current: Typically oscillation of the vortex is triggered with an intensity greater than 17 mA and then persists when the current is lowered to 6 mA.

In many practical cases, the consistent magnetic configuration appearing above the first critical current is not a vortex of perfect cylindrical symmetry but a vortex structure distorted for example due to the magnetostatic field radiated by the magnetization of the reference layer on the magnetization of the oscillating layer. In this case, this consistent magnetization state has a magnetization that, following the magnetic history of the sample, may be closer to parallel orientation or closer to antiparallel orientation with relation to the magnetization of the reference layer. In this case, to obtain the precession effect, it is preferable to choose the current polarity that may destabilize the steady state, thanks to the spin transfer. In other words:

- if the resistance of oscillator 30 in the consistent micromagnetic configuration is closer to the resistance of the antiparallel state AP (i.e., the mean magnetization of the oscillating layer 32 is closer to the antiparallel state AP than to the parallel state P with relation to the magnetization of the reference layer), the current must circulate from the oscillating layer 32 to the reference layer 34 (i.e., the electrons must circulate from reference layer 34 to oscillating layer 32). In this case, the spin transfer effect promotes the parallel alignment of magnetizations and destabilizes the AP state;
- if the resistance of oscillator 30 in the consistent micromagnetic configuration is closer to the resistance of the state P (i.e., the mean magnetization of the oscillating layer 32 is closer to the parallel state than to the antiparallel state with relation to the magnetization of the reference layer), the current must circulate from the reference layer 34 to the oscillating layer 32 (i.e., the electrons must circulate from oscillating layer 32 to reference layer 34). In this case, the spin transfer effect promotes the antiparallel alignment of magnetizations and destabilizes the P state.

If the starting micromagnetic state has a virtually zero mean magnetization due to its cylindrical symmetry (case of the symmetrical vortex of FIG. 2), the current polarity is immaterial.

Figure 8:
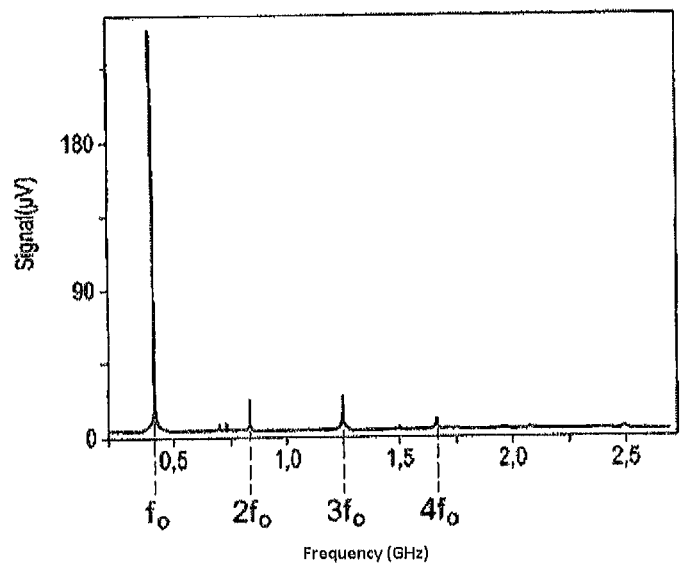
FIG. 8 represents the excitation spectrum according to the frequency for an oscillator according to the invention.

The cyclic movement of the vortex thus obtained results in a cyclic temporal change of the mean magnetization, and consequently in resistance oscillation because of the magnetoresistive effect. Thus alternating voltage may be generated at the terminals of oscillator 30, presenting an intense fundamental mode (typically between 300 and 500 MHz) and many harmonics (typically from 12 to 15). The amplitude of the fundamental mode is very high (>500 000 nV$^2$/Hz) and the bandwidth is on the order of 1 MHz. The harmonics amplitude decreases as the frequency increases; The amplitude of harmonics $2f_0$ and $3f_0$ represents approximately 10% of the amplitude of the fundamental and the amplitude of harmonics $4f_0$ a few % of the amplitude of the fundamental. The bandwidth increases from one band to the next typically by a factor of 2. This phenomenon is illustrated in FIG. 8 that represents the excitation spectrum according to the frequency: A power of the fundamental mode is observed at $f_o$ (400 MHz) on the order of 500 000 nV$^2$/Hz, or a thousand times higher than that obtained with STOs from the prior art, for a power injected by the direct current that is only two to three times higher.

The table below summarizes the typical values that may be obtained with this vortex oscillator. It is observed that these performances for the first 4 bands are much better than STO oscillators from the prior art.

TABLE 1

| Frequency | Amplitude | Bandwidth |
| --- | --- | --- |
| fo = 400 MHz | 500 000 nV$^2$/Hz | 1.2 MHz |
| $2f_0$ = 800 MHz | 50 000 nV$^2$/Hz | 2.4 MHz |
| $3f_0$ = 1.2 GHz | 50 000 nV$^2$/Hz | 5 MHz |
| $4f_0$ = 1.6 GHz | 10 000 nV$^2$/Hz | 10 MHz |
| $5f_0$ = 2 GHz | 3500 nV$^2$/Hz | 20 MHz |

It will be noted that it is possible to increase the fundamental frequency of oscillator 30 by playing with the materials and geometry of the magnetic stack E forming the active part of the device.

Therefore, the frequency of the vortex translation mode, corresponding to an orbital movement of the vortex core, is directly linked to the L/R ratio, where L is the thickness of oscillating layer 32 and R is the radius of this oscillating layer. The natural frequency of the translation mode increases quasi-linearly with this geometric ratio. One may thus contemplate reaching frequencies of 1 to 2 GHz on nanometric samples in which the oscillating layer would have a thickness of 60 nm.

In addition, the choice of materials may also enable the fundamental frequency to be increased. In fact, the orbital movement of the vortex may be understood as the effect resulting on the one hand from the spin transfer torque that tends to cause a centrifugal movement of the vortex core and on the other hand from the amperian field that tends to create an attractive potential at the level of the contacts of CCP layer 33. All the parameters reducing the size of the orbit enable the frequency to be increased: This is why the frequency increases with the current applied, For example. In addition, the frequency will increase with Gilbert damping (cf. Mistral et al., Phys. Rev. Lett. 100, 257201, 2008). Such being the case, it is possible to increase this Gilbert damping by doping the ferromagnetic material used for the oscillating layer 32 with rare earth impurities such as Dy or Tb, for example.

Lastly, reducing the planar anisotropy will contribute to facilitating the formation of a vortex and reaching higher frequencies. This is why it may be wise to control the oxidation of the alumina barrier and/or annealing of the stack (cf. Monso et al. Appl. Phys. Lett. 80, 4157, 2002; Rodmacq et al. Phys. Rev. B 79, 024423, 2009). In fact it has been shown in the articles cited here that significant interfacial anisotropy energy may be created at the interface between a ferromagnetic transition metal and a layer of oxide, when the interface between the ferromagnetic layer and the oxide layer has oxygen terminations, enabling electronic hybridization of some d orbitals of the ferromagnetic metal with sp orbitals of oxygen. From the point of view of energy, oxygen termination is very often the most favorable (for example for Fe/MgO or Co/Alumina). An appropriate annealing therefore promotes the migration of oxygen to the interface to promote the development of this perpendicular anisotropy. This perpendicular anisotropy should not cause the magnetization of the oscillating layer to go out of the plane but reduces its "easy plane" anisotropy, or in other words increases its out-of-plane susceptibility.

Layer 33 with strong lateral conductivity inhomogeneity based on a pinhole structure (CCP) is only an example of embodiment. As mentioned above, layer 33 with strong lateral conductivity inhomogeneities is a layer presenting in its plane strong lateral electrical conductivity inhomogeneities (typically characterized by conductivity fluctuations of more than a factor of 10 between the most conductive areas and the least conductive areas of layer 33).

Therefore, it is entirely possible to use other means enabling current inhomogeneities to be generated at the level of the surface of the oscillating layer. By way of example, FIG. 5 illustrates a second embodiment of an oscillator 50 according to the invention.

Figure 5:
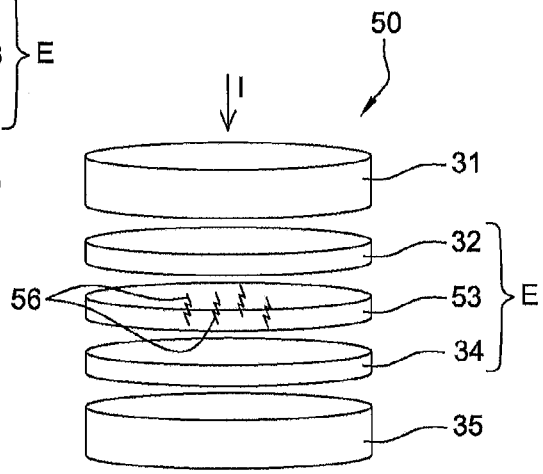
FIG. 5 illustrates a second embodiment of an oscillator according to the invention.

Oscillator 50 of FIG. 5 is identical to oscillator 30 of FIG. 4 (common elements bear the same reference numbers), the only difference relating to layer 53 with strong lateral electrical conductivity homogeneities different from layer 33 from FIG. 4.

In the case of FIG. 5, layer 53 with strong lateral electrical conductivity inhomogeneities capable of inducing in oscillating layer 32 strong current inhomogeneities is obtained by starting from a magnetic tunnel junction to which electrical stress close to the electric breakdown of the junction is applied. For example, alumina or MgO tunnel barriers with a thickness of between 1 and 2 nm break down electrically on voltages on the order of 1 to 2V. For a given junction, the breakdown voltage depends in fact on the duration and number of voltage pulses and mainly on the cumulative time during which the junction is exposed to the high voltage. It is known that, before breaking down in a complete and irreversible manner, the tunnel barrier may locally degrade under the effect of the electrical stress, leading to the appearance of "hot spots" 56 in the junction. The appearance of these hot spots 56 may be monitored by measuring the electrical resistance of the junction being crossed by a current perpendicular to the interfaces. A total breakdown of the barrier leads to a drop in the electrical resistance of the barrier typically by a factor of 10 to 100 (for example a drop in resistance of 5 kilohms to a few hundred or tens of ohms). But before reaching this total breakdown stage, it is possible, by gradually increasing the voltage, to reach intermediate resistance values between the initial value and typically a quarter or a tenth of the initial value. In these situations, incipient pinholes (hot spots) are created but a significant part of the current continues to pass by the tunnel effect through the barrier. The hot spots 56 thus formed may thus play the same role as pinholes 36 in the CCP structure (FIG. 4).

A more general way to create layers generating strong lateral current inhomogeneities consists of using alloys or composites of at least two materials having electrical conductivities that are very different and that tend to demix. This is the case for example with certain semiconductor/metal alloys such as for example GeCu that, during annealing, tend to form conductive clusters of $Cu_3Ge$ in a semiconductor Ge matrix. This is also the case with certain diluted semiconductors (for example ZnOCo) tending to form Co-rich clusters in a ZnO matrix. This is also the case with materials such as GeMn that tend to form conductive nanocolumns of Mn-rich alloys, parallel to the direction of growth, embedded in a weakly conductive semiconductor matrix.

According to another alternative, current inhomogeneity may be created by producing, using microelectronic top-down techniques or nanoindentation, nanocontacts of size and position distributed at the base or top of the magnetoresistive pillar in the immediate vicinity of the surface of the oscillating layer. It is seen that in this case, means able to generate current inhomogeneities at the level of the surface of the oscillating layer are not created by a layer (CCP, layer with hot spots, etc.) but by a plurality of nanocontacts on the surface of the oscillating layer.

In the different examples cited above for producing means generating current inhomogeneities at the level of the surface of the oscillating layer, electrons may have or not have the capacity to conserve their spin when crossing these means. In the case of CCP structures (FIG. 4) with pinholes of non-magnetic metal (such as copper), the electrons keep significant spin polarization when crossing the layer. The same is true for tunnel junctions that are partially degraded at hot spots (FIG. 5). In these cases where the spin polarization is conserved when the electrons traverse this layer with laterally inhomogeneous electrical conductivity, then this layer may be situated between the reference layer and the oscillating layer. Spin conservation of electrons when crossing this layer in fact enables significant magnetoresistance amplitude to be maintained. In cases where the spin polarization of electrons is destroyed when crossing this layer with inhomogeneous lateral conductivity (the case with GeMn, ZnOCo, CuGe layers), then this layer must be situated out of the area producing the magnetoresistance of the structure, i.e., the area comprising all or part of the oscillating layer, the spacer and all or part of the reference layer in order to not degrade the magnetoresistance signal of the structure.

Figure 6:
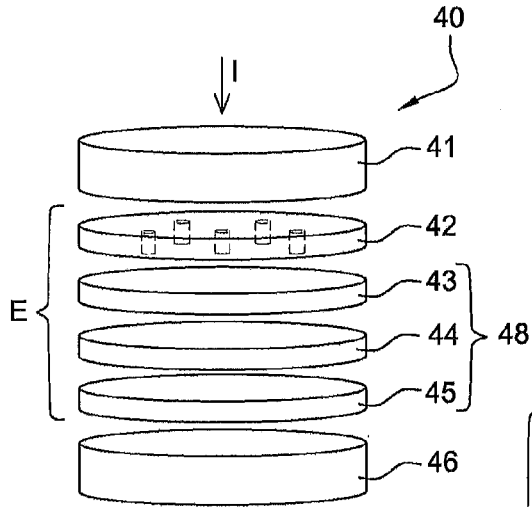
FIG. 6 illustrates a third embodiment of an oscillator according to the invention.

In order to illustrate this last paragraph, FIG. 6 schematically represents a third embodiment of an oscillator 40 according to the invention in which layer 42 with strong lateral conductivity inhomogeneities is outside of area 48 producing the magnetoresistance.

More precisely, oscillator 40 comprises a magnetic stack E successively including:
  a ferromagnetic reference layer 45 with a fixed magnetization direction (here situated in the plane of the reference layer), known as the pinned layer;
  an amagnetic (non magnetic) decoupling layer 44, conventionally called a spacer, for example in oxide;
  a ferromagnetic oscillating layer 43 with a variable magnetization direction presenting a magnetic configuration such as already described with reference to FIGS. 1 to 3.
  a layer with strong lateral electrical conductivity inhomogeneities 42.

This stack E formed by the assembly of layers above is inserted between two current input electrodes 41 and 46 causing the flow of an electrical current of intensity I perpendicularly to the plane of the stack of magnetic layers. The two electrodes 41 and 46 form current supply means capable of causing the flow of a current of electrons perpendicularly to the plane of magnetic stack E.

In this third embodiment, layer 42 with strong lateral conductivity inhomogeneity is placed not between reference layer 45 and oscillating layer 43 but at another location, here on the back of oscillating layer 43, i.e., on the side of oscillating layer 43 opposite from spacer 44 between oscillating layer 43 and reference layer 45. It will be noted that one may also use nanocontacts on the back of oscillating layer 45 or one may integrate the layer with strong lateral conductivity inhomogeneity inside the oscillating layer. One may also have a layer with strong lateral conductivity inhomogeneity situated in the reference layer or on the back of it.

In this third embodiment, it is not necessary for the electrons to conserve a large part of their spin polarization by crossing layer 42 with strong lateral conductivity inhomogeneity since they then repolarize by crossing oscillating layer 43 or reference layer 45 (along the side on which layer 42 with strong conductivity inhomogeneity was placed), which enables the magnetoresistance to remain significant. In this embodiment, spacer 44 separating oscillating layer 43 from reference layer 45 must ensure good magnetic decoupling between oscillating layer 43 and reference layer 45. This spacer 44 must conserve a large part of the spin polarization of electrons so that the magnetoresistance of oscillator 40 is significant.

Figure 7:
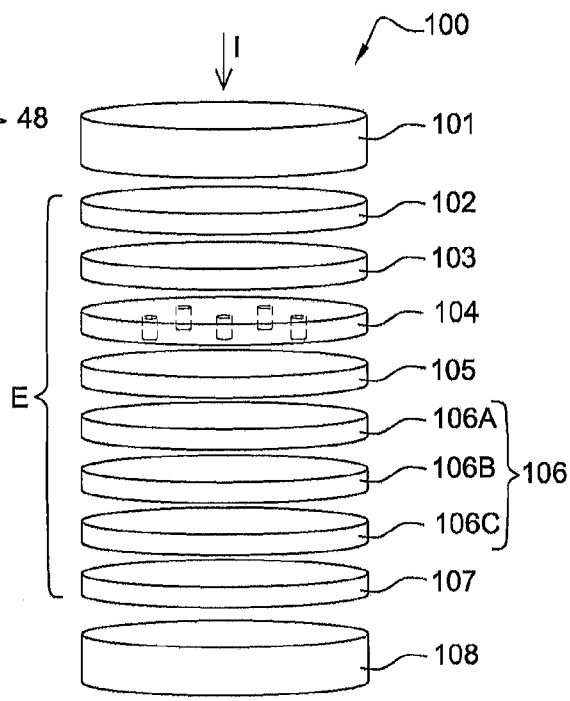
FIG. 7 illustrates a fourth embodiment of an oscillator according to the invention.

FIG. 7 schematically illustrates a fourth embodiment of an oscillator 100 according to the invention.

Oscillator 100 comprises a magnetic stack E including:
An antiferromagnetic pinning layer 107;
a ferromagnetic reference layer 106 with a fixed magnetization direction (here situated in the plane of the reference layer), known as the pinned layer; here this layer 106 is by way of example a synthetic antiferromagnetic layer, i.e., is constituted of two ferromagnetic layers 106C and 106A antiparallel coupled through a thin antiparallel coupling layer 106B; here reference layer 106 is pinned by antiferromagnetic layer 107;
a non-magnetic metallic layer 105;
a layer with strong lateral electrical conductivity inhomogeneities 104;
a non-magnetic metallic layer 103;
an oscillating ferromagnetic layer 102 of variable magnetization direction presenting a magnetic configuration in conformance with the explanations given in reference to FIGS. 1 to 3.

This stack E formed by the assembly of layers above is inserted between two current input electrodes 101 and 108 causing the flow of an electrical current of intensity I perpendicularly to the plane of the stack of magnetic layers. The two electrodes 101 and 108 form current supply means capable of causing the flow of a current of electrons perpendicularly to the plane of magnetic stack E.

According to this fourth embodiment, layer 104 with strong lateral conductivity inhomogeneity comprises on each side (it will be noted that this may only be one side or the other) one or more non-magnetic metallic layers (for example in copper) 103 and 105 respectively separating layer 104 with strong conductivity inhomogeneity from oscillating ferromagnetic layer 102 or reference layer 106. These additional non-magnetic layers 103 and 105 increase the magnetic decoupling between the oscillating and reference layers and may prove to be useful from the point of view of the growth of stack E. It will be noted that oscillating layer 102 may also be formed from a combination of magnetic layers such as for example CoFe 1 nm/NiFe 2 nm.

Figure 9:
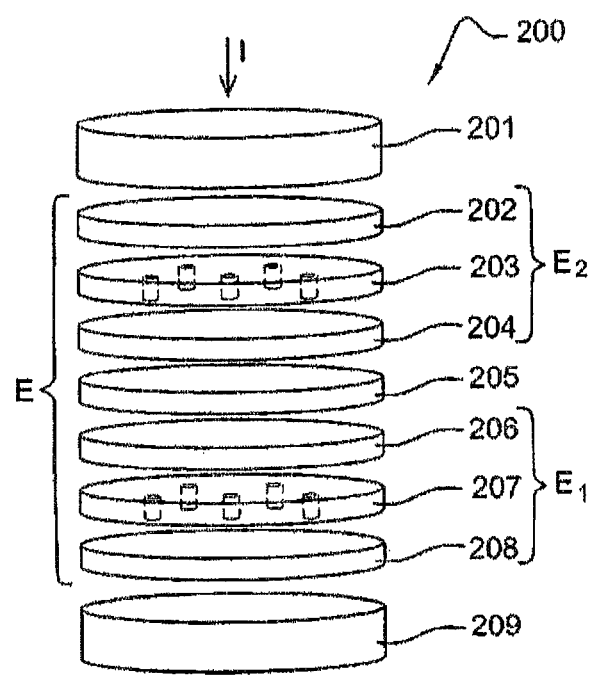
FIG. 9 illustrates a fifth embodiment of an oscillator according to the invention.

FIG. 9 schematically illustrates a fifth embodiment of an oscillator 200 according to the invention.

Oscillator 200 comprises a magnetic stack E successively including:
a first magnetic stack E1 successively comprising:
a ferromagnetic reference layer 208 with a fixed magnetization direction;
a layer with strong lateral electrical conductivity inhomogeneities 207;
a ferromagnetic oscillating layer 206 with a variable magnetization direction presenting a magnetic configuration in conformance with the explanations given in reference to FIGS. 1 to 3;
a magnetic decoupling spacer 205;
a second magnetic stack E2 successively comprising:
a ferromagnetic oscillating layer 204 with a variable magnetization direction presenting a magnetic configuration in conformance with the explanations given in reference to FIGS. 1 to 3;
a layer with strong lateral electrical conductivity inhomogeneities 203;
a ferromagnetic reference layer 202 with a fixed magnetization direction.

This stack E formed by the assembly of layers above is inserted between two current input electrodes 201 and 209 causing the flow of an electrical current of intensity I perpendicularly to the plane of the stack of magnetic layers. The two electrodes 201 and 209 form current supply means capable of causing the flow of a current of electrons perpendicularly to the plane of magnetic stack E.

According to this fifth embodiment, structure 200 comprises several oscillating layers (two in the present case) and several layers with strong lateral conductivity inhomogeneity (two in the present case). The two oscillating ferromagnetic layers 206 and 204 are separated by the spacer 205 intended to reduce the magnetic coupling between the two oscillating ferromagnetic layers. The two layers with strong lateral conductivity inhomogeneity 207 and 203 each respectively separate an oscillating ferromagnetic layer 206 and 204 from a ferromagnetic reference layer 208 and 202. In this embodiment, the magnetoresistance comes from the two stacks E1 and E2. Preferentially, the layers with strong conductivity inhomogeneity 207 and 203 conserve the spin of electrons so that the magnetoresistance is significant.

It will be noted that one of the oscillating layers 206 or 204 may be replaced by a synthetic antiferromagnetic layer constituted of two soft ferromagnetic layers separated by a antiferromagnetic coupling layer (for example in ruthenium with a thickness of 0.6 nm as known to the person skilled in the art).

Figure 10:
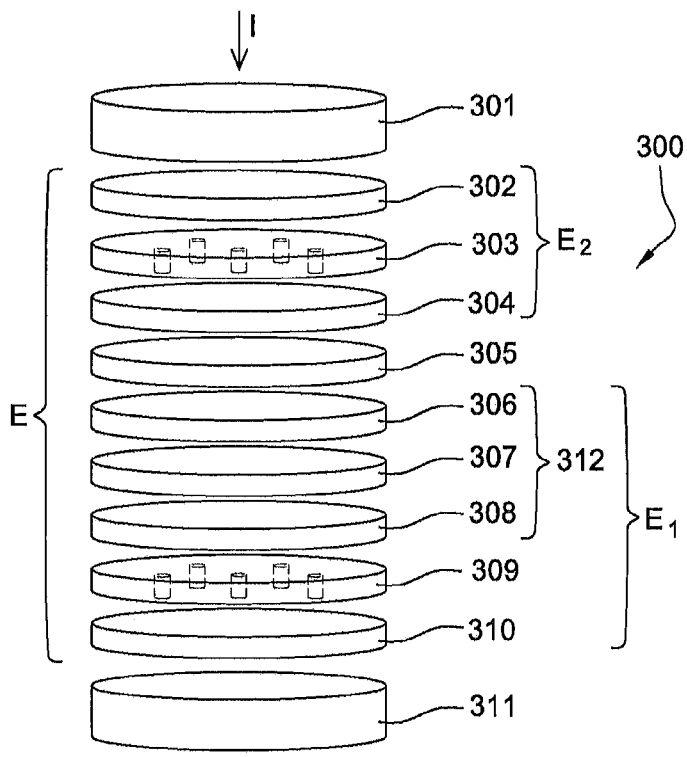
FIG. 10 illustrates a sixth embodiment of an oscillator according to the invention.

This sixth embodiment is illustrated in FIG. 10; in this case, oscillator 300 comprises a magnetic stack E successively including:
a first magnetic stack E1 successively comprising:
a ferromagnetic reference layer 310 with a fixed magnetization direction
a layer with strong lateral electrical conductivity inhomogeneities 309;
a synthetic antiferromagnetic oscillating layer 312 presenting a magnetic configuration in conformance with the explanations given in reference to FIGS. 1 to 3 and comprising two soft ferromagnetic layers 308 and 306 separated by an antiferromagnetic coupling layer 307;
a magnetic decoupling spacer 305;
a second magnetic stack E2 successively comprising:
a ferromagnetic oscillating layer 304 with a variable magnetization direction presenting a magnetic configuration in conformance with the explanations given in reference to FIGS. 1 to 3;
a layer with strong lateral electrical conductivity inhomogeneities 303;
a ferromagnetic reference layer 302 with a fixed magnetization direction;.

This stack E formed by the assembly of layers above is inserted between two current input electrodes 301 and 311 causing the flow of an electrical current of intensity I perpendicularly to the plane of the stack of magnetic layers. The two electrodes 301 and 311 form current supply means capable of causing the flow of a current of electrons perpendicularly to the plane of magnetic stack E.

The thicknesses of the two constituent ferromagnetic layers 308 and 306 of the resulting oscillating layer will then advantageously be made asymmetrical such that the effect of the resulting amperian field acting on ferromagnetic layer 308 in contact with the layer with strong lateral conductivity inhomogeneity 309 has the right sign so that oscillations are triggered in the ferromagnetic layer in contact with the layer with strong lateral current inhomogeneity. The vortices formed in the two layers 306 and 308 have opposite chiralities since these two layers are antiferromagnetically coupled through layer 307 (i.e., one vortex rotates clockwise and the other rotates in the opposite direction). Therefore, the amperian field created by the current reinforces the formation of one of these two vortices but tends to prevent the formation of the other. Therefore if the thicknesses of the two layers 306 and 308 are equal, vortices are formed with difficulty. It is therefore desirable that the layer in which the vortex has the right direction in relation to the amperian field is thicker than that in which the vortex opposes the amperian field such that the effect of the "right" layer (i.e., the layer in which the vortex has the right direction in relation to the amperian field) carries it.

Figure 11:
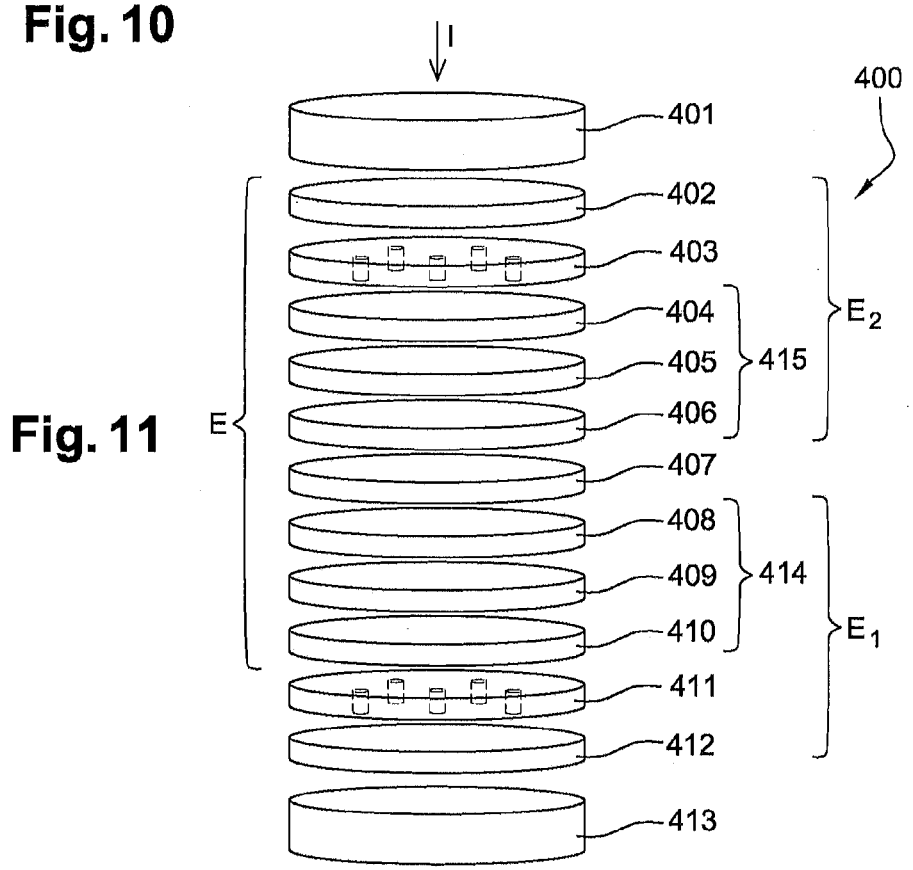
FIG. 11 illustrates a seventh embodiment of an oscillator according to the invention.

FIG. 11 illustrates a seventh embodiment of an oscillator 400 according to the invention. Here, the two oscillating layers are each replaced by a synthetic antiferromagnetic layer constituted of two soft ferromagnetic layers separated by an antiferromagnetic coupling layer.

Oscillator 400 comprises a magnetic stack E successively including:
  a first magnetic stack E1 successively comprising:
    a ferromagnetic reference layer 412 with a fixed magnetization direction
    a layer with strong lateral electrical conductivity inhomogeneities 411;
    a synthetic antiferromagnetic oscillating layer 414 presenting a magnetic configuration in conformance with the explanations given in reference to FIGS. 1 to 3 and comprising two soft ferromagnetic layers 410 and 408 separated by an antiferromagnetic coupling layer 409;
  a magnetic decoupling spacer 407;
  a second magnetic stack E2 successively comprising:
    a synthetic antiferromagnetic oscillating layer 415 presenting a magnetic configuration in conformance with the explanations given in reference to FIGS. 1 to 3 and comprising two soft ferromagnetic layers 406 and 404 separated by an antiferromagnetic coupling layer 405;
    a layer with strong lateral electrical conductivity inhomogeneities 403;
    a ferromagnetic reference layer 402 with a fixed magnetization direction.

This stack E formed by the assembly of layers above is inserted between two current input electrodes 401 and 413 causing the flow of an electrical current of intensity I perpendicularly to the plane of the stack of magnetic layers. The two electrodes 401 and 413 form current supply means capable of causing the flow of a current of electrons perpendicularly to the plane of magnetic stack E.

As for the embodiment from FIG. 10, the thicknesses of the two constituent ferromagnetic layers (respectively 410 and 408 and 406 and 404) of the synthetic antiferromagnetic sandwich will advantageously be made asymmetrical such that the effect of the resulting amperian field acting on the ferromagnetic layer (respectively 410 and 404) in contact with the layer with strong lateral conductivity inhomogeneity (respectively 411 and 403) has the right sign so that oscillations are triggered in the ferromagnetic layer in contact with the layer with strong lateral current inhomogeneity.

Figure 12:
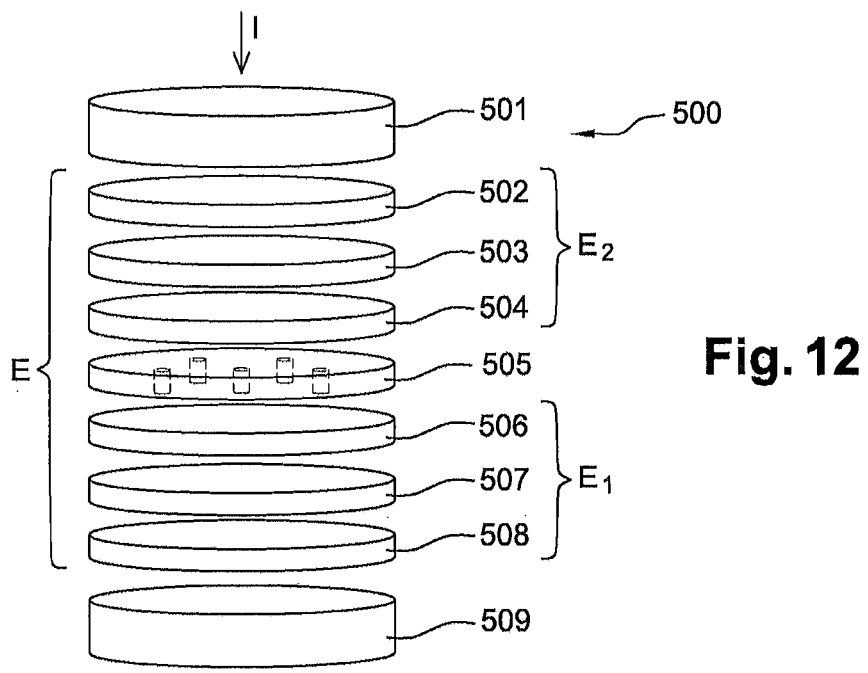
FIG. 12 illustrates an eighth embodiment of an oscillator according to the invention.

FIG. 12 illustrates an eighth embodiment of an oscillator according 500 to the invention.

Oscillator 500 comprises a magnetic stack E successively including:
  a first sub-stack E1 successively comprising:
    a first ferromagnetic reference layer 508 with a fixed magnetization direction (here situated in the plane of the reference layer), known as the pinned layer;
    a first amagnetic (non magnetic) decoupling layer 507, conventionally called a spacer, for example in oxide;
    a first ferromagnetic oscillating layer 506 with a variable magnetization direction presenting a magnetic configuration such as already described with reference to FIGS. 1 to 3;
    a layer with strong lateral electrical conductivity inhomogeneities 505;
  a second sub-stack E2 successively comprising:
    a second ferromagnetic oscillating layer 504 with a variable magnetization direction presenting a magnetic configuration such as already described with reference to FIGS. 1 to 3;
    a second amagnetic (non magnetic) decoupling layer 503, conventionally called a spacer;
    a second ferromagnetic reference layer 502 with a fixed magnetization direction (here situated in the plane of the reference layer), known as the pinned layer.

This stack E formed by the assembly of layers above is inserted between two current input electrodes 501 and 509 causing the flow of an electrical current of intensity I perpendicularly to the plane of the stack of magnetic layers. The two electrodes 501 and 509 form current supply means capable of causing the flow of a current of electrons perpendicularly to the plane of magnetic stack E.

According to the latter embodiment, the two ferromagnetic oscillating layers 506 and 504 are separated by layer 505 with strong conductivity inhomogeneity. One and/or the other of the ferromagnetic layers may be replaced by a synthetic antiferromagnetic layer constituted of two antiferromagnetically coupled ferromagnetic layers.

Figure 13:
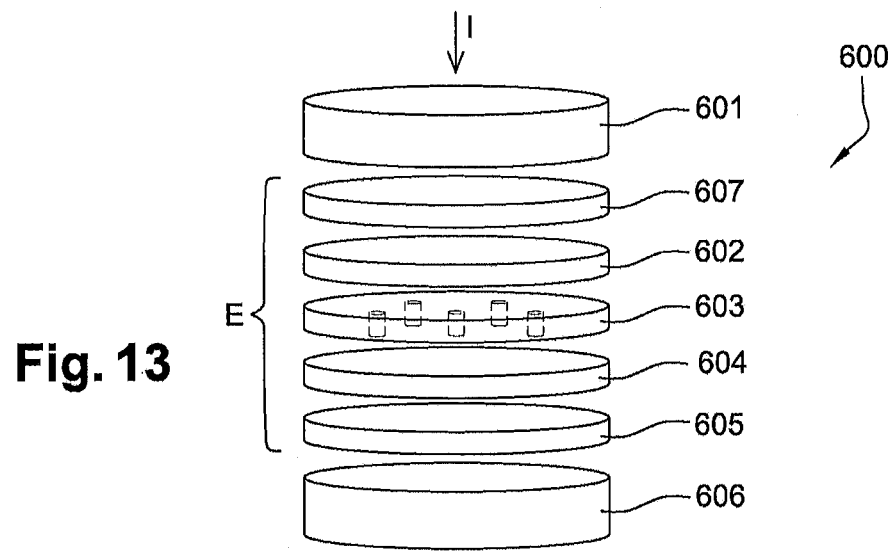
FIG. 13 illustrates a ninth embodiment of an oscillator according to the invention.

As mentioned above, the oscillator according to the invention may also operate with two oscillating layers without a reference layer, the only condition being that the magnetic stack comprises at least two magnetic layers, one of which is an oscillating layer with variable magnetization direction. Such a configuration is illustrated in FIG. 13 that represents an oscillator 600 according to a ninth embodiment of the invention.

Oscillator 600 comprises a magnetic stack E successively including:
  a buffer layer 605;
  a first ferromagnetic oscillating layer 604 with a variable magnetization direction presenting a magnetic configuration such as already described with reference to FIGS. 1 to 3;
  a layer with strong lateral electrical conductivity inhomogeneities 603;
  a second ferromagnetic oscillating layer 602 with a variable magnetization direction presenting a magnetic configuration such as already described with reference to FIGS. 1 to 3;
  a cover layer 607.

This stack E formed by the assembly of layers above is inserted between two current input electrodes 601 and 606 causing the flow of an electrical current of intensity I perpendicularly to the plane of the stack of magnetic layers. The two electrodes 601 and 606 form current supply means capable of causing the flow of a current of electrons perpendicularly to the plane of magnetic stack E.

According to this ninth embodiment, stack E comprises at least two oscillating layers 604 and 602 but no longer comprises reference layers. The electrons are polarized by crossing a first oscillating layer and exert spin transfer on the magnetization of the second oscillating layer by traversing it. Oscillations result from competition between the amperian field created by the current crossing the structure and the spin transfer from one oscillating layer to the other. Stack E also comprises a spacer 603 constituted of a layer with strong lateral conductivity inhomogeneity. Buffer layer 605 (for example in Ta, NiFeCr or CuN) is a layer intended to promote good growth of stack E. Cover layer 607 is a set of functional layers necessary for developing and etching the magnetoresistive pillar.

Figure 14:
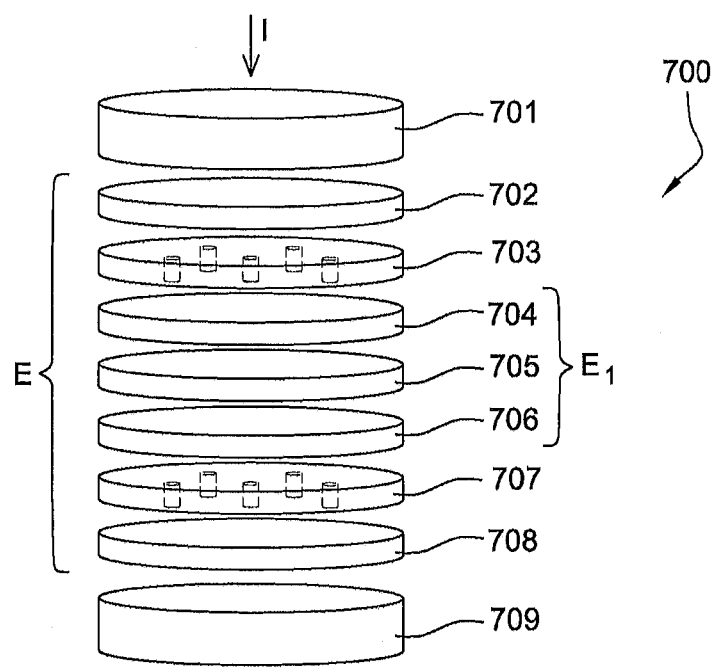
FIG. 14 illustrates a tenth embodiment of an oscillator according to the invention.

FIG. 14 represents a tenth embodiment of an oscillator 700 according to the invention that constitutes a variation of the embodiment illustrated in FIG. 13.

Oscillator 700 comprises a magnetic stack E successively including:
- a buffer layer 708;
- a first layer with strong lateral electrical conductivity inhomogeneities 707;
- a first ferromagnetic oscillating layer 706 with a variable magnetization direction presenting a magnetic configuration such as already described with reference to FIGS. 1 to 3;
- an amagnetic magnetic decoupling spacer layer 705;
- a second ferromagnetic oscillating layer 704 with a variable magnetization direction presenting a magnetic configuration such as already described with reference to FIGS. 1 to 3;
- a second layer with strong lateral electrical conductivity inhomogeneities 703;
- a cover layer 702.

This stack E formed by the assembly of layers above is inserted between two current input electrodes 701 and 709 causing the flow of an electrical current of intensity I perpendicularly to the plane of the stack of magnetic layers. The two electrodes 701 and 709 form current supply means capable of causing the flow of a current of electrons perpendicularly to the plane of magnetic stack E.

As with the previous embodiment, stack E again comprises at least two oscillating layers 706 and 704 but no longer comprises reference layers. The electrons are polarized by crossing an oscillating layer and exert spin transfer on the magnetization of the other oscillating layer by traversing it. Oscillations result from competition between the amperian field created by the current crossing the structure and the spin transfer from an oscillating layer to the other. Layers with strong conductivity inhomogeneity 707 and 703 are situated not between the two oscillating layers 706 and 704 but outside the ferromagnetic oscillating layers on opposite sides with relation to the magnetic decoupling spacer 705 separating them; It will be noted that layers with strong conductivity inhomogeneity 707 and 703 may also be situated inside the oscillating layers.

In these last two embodiments (FIGS. 13 and 14), one or more of the oscillating layers may also be synthetic antiferromagnetic layers.

As seen previously, it is preferable that the form of the oscillator according to the invention has a substantially cylindrical symmetry if one seeks to exploit the fundamental excitation signal. But other forms are possible if one seeks to amplify the harmonics signals.

Therefore, it is possible to increase the amplitude of certain harmonics by producing a structure that is not substantially circular, but of the elliptical type, or having at least 3 lobes and axial symmetry, thus forming a flower with 3, 4 (form 800 illustrated in FIG. 15) or more petals in order to amplify the non-uniformities of movement of the vortex core. When the cross section of the structure is not circular but presents more elongated parts (such as the petals of a flower), the vortex core will engage in these elongated parts longer. Therefore, instead of carrying out a uniform rotation, the vortex will instead jump from one petal to another, thus reinforcing the harmonics corresponding to the number of "petals." This leads to amplification of higher harmonics, thus enabling work at frequencies that are significantly higher than the fundamental mode.

Of course, the oscillator according to the invention is not limited to the embodiments that have just been described for indicative and in no way limiting purposes with reference to the figures.

The invention claimed is:

1. A spin transfer oscillator comprising:
a magnetic stack including at least two magnetic layers in which at least one of said two magnetic layers is an oscillating layer that has variable direction magnetization; and
a current supply device configured to cause a flow of a current of electrons perpendicularly to the plane of said magnetic stack;
wherein said magnetic stack comprises a device configured to generate inhomogeneities of current at the level of the surface of said oscillating layer, wherein an intensity of the current provided by said current supply device is chosen such that the magnetization of said oscillating layer presents a consistent magnetic configuration, said magnetic configuration oscillating in its entirety at a same fundamental frequency.

2. The oscillator according to claim 1, wherein said device configured to generate current inhomogeneities at the level of the surface of said oscillating layer is formed by a layer presenting strong conductivity inhomogeneities able to generate in said oscillating layer strong lateral current inhomogeneities.

3. The oscillator according to claim 2, wherein said layer presenting strong conductivity inhomogeneities able to generate in said oscillating layer strong lateral current inhomogeneities is a layer having, in use, conductivity fluctuations of more than a factor of 10 between its most conductive areas and its least conductive areas.

4. The oscillator according to claim 2, wherein said layer presenting strong conductivity inhomogeneities is an insulating layer integrating metal paths.

5. The oscillator according to claim 2, wherein said layer presenting strong conductivity inhomogeneities is a tunnel junction integrating conductive paths obtained by exposure of said junction to a suitable voltage.

6. The oscillator according to claim 2, wherein said layer presenting strong conductivity inhomogeneities is made from a base of a mixture of two materials with different conductivities able to demix under the effect of annealing to form paths locally that are more conductive than on the rest of the layer.

7. The oscillator according to claim 2, wherein said layer presenting strong conductivity inhomogeneities presents a ratio equal to or greater than the conductivity between its most conductive areas and its least conductive areas.

8. The oscillator according to claim 2, wherein said oscillator comprises a non-magnetic metallic layer in contact with at least one of the faces of said layer presenting strong conductivity inhomogeneities.

9. The oscillator according to claim 1, wherein said device configured to generate current inhomogeneities at the level of the surface of said oscillating layer is formed by a plurality of nanocontacts.

10. The oscillator according to claim 1, wherein said consistent magnetic configuration is a configuration of the magnetic vortex, anti-magnetic vortex, multivortex or "C-state" type, or a combination thereof.

11. The oscillator according to claim 1, wherein said magnetic stack has the form of a pillar, a cross section of which has one of the following forms:
- circular;
- elliptical;
- annular; or
- form with axial symmetry comprising at least three lobes.

12. The oscillator according to claim 11, wherein a diameter of a circular, annular or flower-shaped cross section and a largest of two diameters of a cell of elliptical form is between 10 nm and 500 nm.

13. The oscillator according to claim 1, wherein said oscillating layer presents a substantially circular cross section with a radius R and thickness L, the L/R ratio being chosen according to an operating frequency of the oscillator.

14. The oscillator according to claim 1, wherein said magnetic stack successively comprises:
- a magnetic reference layer with a fixed magnetization direction;
- a layer with strong lateral electrical conductivity inhomogeneities; and
- said oscillating magnetic layer with a variable magnetization direction.

15. The oscillator according to claim 14, wherein said magnetic stack successively comprises two magnetic sub-stacks separated by a magnetic decoupling layer, each of the two sub-stacks integrating:
- a magnetic reference layer with a fixed magnetization direction;
- a layer with strong lateral electrical conductivity inhomogeneities; and
- an oscillating magnetic layer with a variable magnetization direction.

16. The oscillator according to claim 1, wherein said magnetic stack comprises a magnetic sub-stack successively including:
- a magnetic reference layer with a fixed magnetization direction;
- an amagnetic decoupling layer; and
- said oscillating magnetic layer with a variable magnetization direction;

said device configured to generate current inhomogeneities at the level of the surface of said oscillating layer being located outside of said sub-stack.

17. The oscillator according to claim 1, wherein said magnetic stack comprises two magnetic sub-stacks, each sub-stack successively including:
- a magnetic reference layer with a fixed magnetization direction;
- an amagnetic decoupling layer; and
- an oscillating magnetic layer with a variable magnetization direction;

said two sub-stacks being separated by a layer presenting strong conductivity inhomogeneities.

18. The oscillator according to claim 1, wherein said magnetic stack comprises two ferromagnetic oscillating layers with variable magnetization direction separated by said device configured to generate current inhomogeneities at the level of the surface of said oscillating layers.

19. The oscillator according to claim 1, said magnetic stack comprises:
- a magnetic sub-stack successively including:
- a first oscillating magnetic layer with a variable magnetization direction;
- an amagnetic decoupling layer;
- a second oscillating magnetic layer with a variable magnetization direction;
- a first means device configured to generate current inhomogeneities at the level of the surface of said first oscillating layer; and
- a second means device configured to generate current inhomogeneities at the level of the surface of said second oscillating layer;

said first and second devices configured to generate current inhomogeneities located outside said sub-stack.

20. The oscillator according to claim 19, wherein each of said first and second devices is formed by a layer presenting strong conductivity inhomogeneities.

21. The oscillator according to claim 1, wherein said current supply device includes two electrodes arranged on opposite sides of the magnetic stack.

* * * * *